(12) United States Patent
Juliano et al.

(10) Patent No.: US 10,396,225 B2
(45) Date of Patent: Aug. 27, 2019

(54) PHOTOVOLTAIC MODULE WITH IMPROVED MOISTURE PROTECTION LAYER

(71) Applicant: MIASOLÉ HI-TECH CORP., Santa Clara, CA (US)

(72) Inventors: Daniel R. Juliano, Santa Clara, CA (US); Todd Krajewski, Mountain View, CA (US); Kedar Hardikar, Santa Clara, CA (US)

(73) Assignee: BEIJING APOLLO DING RONG SOLAR TECHNOLOGY CO., LTD., Beijing (CN)

( * ) Notice: Subject to any disclaimer, the term of this patent is extended or adjusted under 35 U.S.C. 154(b) by 132 days.

(21) Appl. No.: 15/181,766

(22) Filed: Jun. 14, 2016

(65) Prior Publication Data

US 2017/0358699 A1 Dec. 14, 2017

(51) Int. Cl.
*H01L 31/048* (2014.01)

(52) U.S. Cl.
CPC ........ *H01L 31/0481* (2013.01); *H01L 31/048* (2013.01); *H01L 31/0488* (2013.01); *Y02E 10/50* (2013.01)

(58) Field of Classification Search
CPC .................................................. H01L 31/0481
See application file for complete search history.

(56) References Cited

U.S. PATENT DOCUMENTS

| 5,478,402 | A | 12/1995 | Hanoka |
| 2003/0079772 | A1 | 5/2003 | Gittings et al. |
| 2006/0284556 | A1 | 12/2006 | Tremel et al. |
| 2008/0006323 | A1 | 1/2008 | Kalkanoglu et al. |
| 2008/0289681 | A1 | 11/2008 | Adriani et al. |
| 2008/0289682 | A1* | 11/2008 | Adriani ............ B32B 17/10018 |
| | | | 136/251 |
| 2009/0314327 | A1 | 12/2009 | Saha et al. |
| 2010/0151238 | A1 | 6/2010 | Burmeister et al. |
| 2010/0243052 | A1 | 9/2010 | Gittings et al. |
| 2011/0036390 | A1 | 2/2011 | Nelson et al. |
| 2012/0097194 | A1 | 4/2012 | McDaniel et al. |

(Continued)

FOREIGN PATENT DOCUMENTS

EP    2 277 694 A1    1/2011

OTHER PUBLICATIONS

Traver, R. et al., "Increasing Solar Panel Production Efficiencies with Acrylic Foam Tape," Global Solar Technology, vol. 3, No. 5, pp. 30-32, (2010).

(Continued)

*Primary Examiner* — Tae-Sik Kang
(74) *Attorney, Agent, or Firm* — The Marbury Law Group, PLLC

(57) ABSTRACT

A photovoltaic module includes front and back sealing layers and at least one photovoltaic cell positioned located therebetween. A moisture resistant layer provided between the first and second sealing layers extends around a portion of a perimeter of the at least one photovoltaic cell. A moisture barrier structure including moisture barrier particles is operatively connected to the sealing layers. The moisture barrier structure improves the moisture resistance of the sealing layer and decreases the water vapor transmission rate into the photovoltaic module.

14 Claims, 5 Drawing Sheets

(56) References Cited

U.S. PATENT DOCUMENTS

2013/0008482 A1* 1/2013 Stancel ............... H01L 31/05
 136/244
2014/0144504 A1* 5/2014 Jang ................. H01G 9/2077
 136/259

OTHER PUBLICATIONS

U.S. Office Action for U.S. Appl. No. 13/414,305, dated Mar. 13, 2013, 28 pages.

* cited by examiner

PHOTOVOLTAIC MODULE WITH IMPROVED MOISTURE PROTECTION LAYER

FIELD

The present invention relates generally to sealed photovoltaic modules and methods for their manufacture, and more specifically to photovoltaic modules with improved moisture resistant layers.

BACKGROUND

Photovoltaic cells and modules are widely used for converting solar energy into electrical energy, with multiple photovoltaic cells interconnected and enclosed and sealed within module assemblies.

Various approaches to sealing a photovoltaic module have been taken, primarily focused on improving the composition of sealing materials and developing moisture absorbing additives or desiccants. US Patent Application Publication No. 2010/0243052 describes a butyl rubber moisture resistant layer around the perimeter of a photovoltaic module that comprises a desiccant. This design and other moisture resistant layers of the prior art expose the full cross-sectional area of the moisture resistant layer at the outer edges of the module to the atmosphere, detrimentally increasing the rate of water vapor transmission or "WVTR" into the module.

US Patent Application Publication No. 2003/0079772 describes a photovoltaic module comprising an edge seal which relies on a pre-formed strip or tape of moisture resistant material that can be placed on the module prior to lamination. While various desiccant materials are described therein, the resistance to moisture ingress of the photovoltaic module is limited by the inherent WVTR of the combined moisture resistant tape and desiccant material.

For the foregoing reasons, there is a need for a more reliable system for sealing a photovoltaic module with improved long-term resistance to moisture ingress.

SUMMARY

According to an aspect of the present disclosure, a sealed photovoltaic module is provided, which comprises at least one photovoltaic cell positioned between a first sealing layer and a second sealing layer and having a light incident surface that faces toward a light source during operation. One of the first and second sealing layers overlies the at least one photovoltaic cell and another of the first and second sealing layers underlies the at least one photovoltaic cell. The sealed photovoltaic module further comprises a moisture barrier structure located between the first and second sealing layers and extending around a portion of a perimeter around the at least one photovoltaic cell. The moisture barrier structure comprises a moisture resistant layer and moisture barrier particles embedded within at least a portion of the moisture resistant layer. The moisture barrier particles have a respective maximum dimension that is less than a thickness of the moisture resistant layer between the first and the second sealing layers.

According to another aspect of the present disclosure, a method of forming a sealed photovoltaic module is provided. At least one photovoltaic cell is disposed over a first sealing layer. A moisture resistant layer is disposed at a periphery of the at least one photovoltaic cell located over the first sealing layer. Moisture resistant particles are provided in at least a portion of the moisture resistant layer. The moisture barrier particles can have a respective maximum dimension that is less than the thickness of the moisture resistant layer. A second sealing layer is disposed on the moisture resistant layer to seal the at least one photovoltaic cell within an enclosure including the first sealing layer, the second sealing layer, and the moisture resistant layer.

One embodiment of the present invention provides a system for sealing a photovoltaic module. A moisture resistant material comprising moisture barrier particles (i.e., particles of a moisture barrier material) is distributed in at least a portion of the volume of the moisture resistant layer. In one embodiment, the moisture barrier particles are applied to the surface of the moisture resistant layer that faces the moisture containing atmosphere.

Another embodiment of the invention provides a system for sealing a photovoltaic module comprising a moisture resistant material and moisture barrier foil operatively connected to the moisture resistant material and further configured to decrease the WVTR into the photovoltaic module.

DESCRIPTION OF THE EMBODIMENTS

Figure 1:
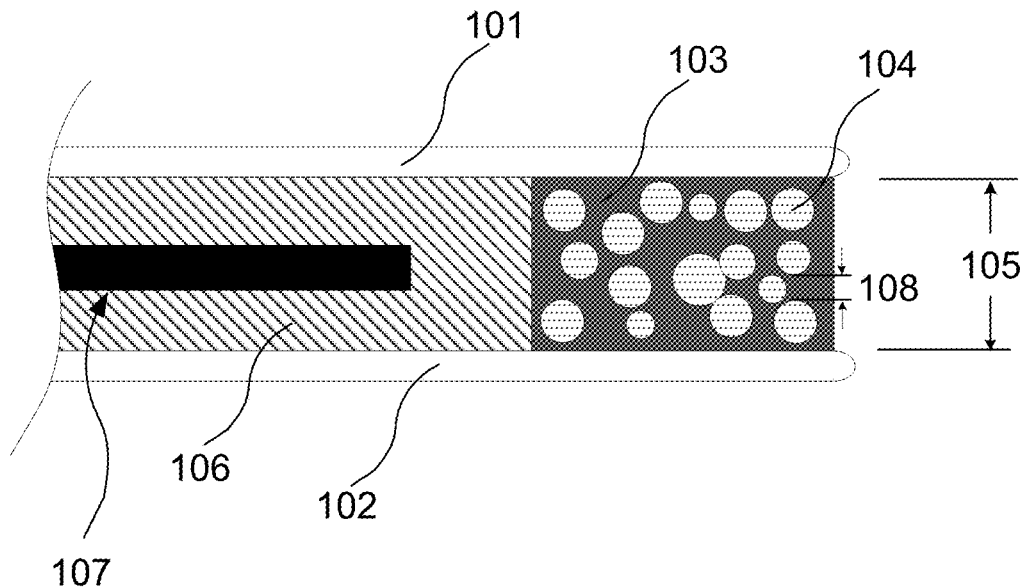
FIG. 1 shows a schematic cross-section of a photovoltaic module with a moisture resistant layer comprising distributed moisture barrier particles according to one embodiment of the invention.

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

The rate of water vapor transmission into a material is governed by the following equation:

$$WVTR = \frac{Q\rho_{sat}(T)RH}{AP_{sat}(T)\cdot(1-RH)},$$

where Q is the flow rate of water vapor in cubic centimeters per minute (cc/min), $p_{sat}(T)$ is the density of water in saturated air at a temperature T, RH is the relative humidity, A is the cross-sectional area of the material, and $P_{sat}(T)$ is the saturation vapor pressure of water vapor at temperature T. In the photovoltaic modules of the prior art, the area term "A" is relatively fixed based on the mechanical construction of the module. In certain embodiments of the present invention, the area A is effectively reduced, thereby decreasing the flow rate of water vapor "Q" into the module without needing to change the inherent WVTR of the sealing material.

The inventors have contemplated novel ways to achieve a reduction in the effective cross-sectional area of a moisture resistant layer in a photovoltaic module while retaining the structural integrity of the module and minimizing any deleterious effects on performance when the module is exposed to accelerated reliability testing such as thermal cycling, ball drop, static load, and related photovoltaic module testing schemes. For example, photovoltaic modules are often required to pass certain reliability tests for sensitivity to moisture, for example UL 1703, a test performed by Underwriters Laboratories, and IEC Performance Standards 61646 and 61730. Article 690 of the 2005 NEC and UL 1703, edition 3, as revised April 2008, are incorporated by reference herein.

Encapsulants are used in photovoltaic modules to encapsulate and protect fragile photovoltaic cells from environmental conditions and mechanical stresses. A typical module has two sealing sheets with one or more photovoltaic cells positioned between the sheets. Encapsulant layers may be provided between one or both sealing sheets and photovoltaic cells. The two encapsulant layers are generally referred to as a front light-incident encapsulant layer and a back encapsulant layer. The front encapsulant layer must be sufficiently transmissive (e.g., having a high optical clarity and low haze) to allow sufficient exposure of the cells to sunlight. In general, encapsulant layers need to have high impact resistance, good shock absorbance, high ultraviolet (UV) light resistance and UV blocking properties, long term thermal stability, good adhesion to sealing sheets (e.g., glass) and other module components, low moisture absorption and high moisture resistance, long term weather-ability, and various other properties.

Encapsulants protect photovoltaic cells by filling voids in between the cells and sealing sheets. Photovoltaic cells often have uneven surfaces caused, for example, by cell interconnects (e.g., current collectors, bypass diodes, and other components). Voids can result from such uneven surfaces, as well as lamination operation defects, and losses in adhesive properties of module components. Voids can lead to moisture permeation, distortion of optical properties, and other undesirable consequences. Encapsulants are configured to fill these voids, for example, during a lamination operation as explained further below. Encapsulants may include thermoplastic polymers that are redistributed during lamination and pushed into void spaces.

FIG. 1 shows a schematic cross-section of an edge of a photovoltaic module according to one embodiment of the invention. For purposes of illustration, the schematic is not drawn to scale. Solar cells 107 are encapsulated between front and back sealing layers (101, 102) using an encapsulating material portion 106. In a preferred embodiment, the front sealing layer is made of glass. For example, a glass plate having greater than 50% transmission, or even greater than 80% or 90% transmission from about 400-1100 nm. In some embodiments, the front sealing layer 101 may have surface treatments such as but not limited to filters, anti-reflective layers, surface roughness, protective layers, moisture barriers, or the like. Although not so limited, in particular embodiments the front layer 101 is a tempered glass plate about 3 mm thick. In other embodiments, the front sealing layer is made of a transparent flexible barrier material with a WVTR of less than 0.01 g/m²/day, for example ULTRA BARRIER FILM™ manufactured by 3M or other suitable materials having a low WVTR.

The back layer 102 may be the same as or different than the front layer 101 and is typically a glass plate as described above. However, since the back layer 102 does not have the same optical constraints as the front layer 101, it may also be composed of materials that are not optimized for light transmission, for example metals and/or polymers. For example the back layer 102 may be a lighter weight flexible material. In such embodiments, the back layer 102 may be a flexible yet weatherable laminate that protects the cells and other module components from moisture, UV exposure, extreme temperatures, etc. The back layer laminate may include a weatherable back sheet exposed to the exterior of the module. The back sheet should be resistant to environmental conditions expected to be experienced by the module (e.g., temperatures of about −40 to 90 degrees C.), so that it is stable throughout the range of temperate climate temperatures and conditions so as to retain its properties to perform its protective function.

The solar cells 107 may be any type of photovoltaic cell including crystalline and thin film cells such as, but not limited to, semiconductor-based solar cells including microcrystalline or amorphous silicon, cadmium telluride, copper indium gallium selenide or copper indium selenide, dye-sensitized solar cells, and organic polymer solar cells. In particular embodiments, the cells are copper indium gallium selenide cells. In other aspects of the invention, the cells can be deposited as thin films on the front, light-incident (e.g., glass) layer 101, which can be a transparent material layer. Direct deposition of a solar cell on glass is described, for example, in US Patent Publication No. 2009/0272437, incorporated by reference herein for this purpose. In such an embodiment, solar cells 107 would be in contact with the front, light-incident layer 101.

The encapsulant material portion 106 interposed between the plurality of solar cells 107 and the light transmissive front layer 101 provides electrical insulation and further protects the underlying solar cells 107 by preventing direct contact between the solar cells and the generally rigid front layer 101. The encapsulant material portion 106 can comprise a light transmissive thermoset (undergoes irreversible curing) or thermoplastic (can be re-melted) polymer. The thickness of the encapsulant between the front layer and the solar cells may be from about 10 to 1000 microns, or about 25 to 700 microns, for example about 600 microns. Of course, in direct deposit embodiments of the invention, the encapsulant in front of the solar cells is absent. The encapsulant material portion 106 may optionally include a CTE modifier, as described in commonly assigned, co-pending U.S. application Ser. No. 12/539,054 entitled CTE MODULATED ENCAPSULANTS FOR SOLAR MODULES, incorporated by reference herein for this purpose.

Suitable materials for the encapsulant are materials that form a durable, electrically insulating seal between the solar cells and the front or back layers. In many embodiments, encapsulants are polymers, in particular thermoplastic polymers. Examples of suitable encapsulants include non-olefin thermoplastic polymers or thermal polymer olefin (TPO). Particular examples include, but are not limited to, polyethylene, polypropylene, polybutylene, polyethylene terephthalate (PET), polybutylene terephthalate (PBT), polystyrene, polycarbonates, fluoropolymers, acrylics, ionomers, silicones and combinations thereof. In some embodiments the encapsulant is a polyethylene, in particular a linear, low density polyethylene solar encapsulant available from Dai Nippon Printing (DNP). Other suitable encapsulants include various SURLYN™ thermoplastic ionomeric resin grades (e.g., PV4000 or equivalent), and SENTRY GLASS™ laminate interlayer available from DuPont, and GENIOMER™ thermoplastic silicone elastomer available from Wacker Chemie.

A moisture resistant layer 103 is provided at a periphery of the encapsulant material portion 106. The moisture resistant layer 103 may be comprised of a material that has a low inherent WVTR (typically less than 1-2 $g/m^2/day$) and, in certain embodiments may absorb moisture and/or prevent its incursion. In one example, a butyl-rubber material containing a zeolite moisture getter or desiccant is used. As shown in FIG. 1, moisture barrier particles 104 are dispersed throughout the moisture resistant layer 103. The moisture barrier particles may comprise any suitable particles that block moisture, such as powder particles or individually pre-manufactured beads (e.g., having a spherical shape or irregular shape). In this embodiment, the moisture barrier particles do not occupy the entire volume of the moisture resistant layer and instead leave small gaps 108 through moisture resistant layer 103 that form a pathway for moisture. While the moisture barrier particles 104 do not completely seal the module, they operate to reduce the effective area of the moisture resistant layer to a value that is smaller than thickness 105 of the moisture restraint layer 103, which would otherwise operate as the effective area dimension for the moisture resistant absent the moisture barrier particles. The moisture barrier particles 104 may be comprised of glass, or in other embodiments comprised of metals such as aluminum, copper, steel, stainless steel, nickel, zinc, silicon, and oxides and/or alloys thereof. In other embodiments, the moisture barrier particles are composed of ceramic materials such as titanium oxide, silicon oxide, silicon carbide, silicon nitride, silicon aluminum oxynitride, zinc oxide, or zinc nitride and the like.

In one embodiment, the moisture barrier particles 104 comprise metal particles, such as metal beads or metal powder particles. In one embodiment, the moisture barrier particles 104 comprise thermoplastic particles, such as thermoplastic beads or powder particles. In one embodiment, the moisture barrier particles 104 comprise ceramic or glass particles, such as ceramic or glass beads or powder particles. In one embodiment, the moisture barrier particles 104 comprise a combination of two different types of particles selected from metal, thermoplastic, and ceramic or glass particles.

In a preferred embodiment, the moisture barrier particles 104 are selected to have a range of diameters or characteristic lengths no greater than spacing 105. For example, in an example embodiment the spacing between sealing layers is approximately 1.0 millimeters to 1.5 millimeters around the perimeter of the module, and the maximum diameter of the moisture barrier particles 104 distributed within moisture barrier layer 103 can be less 1.5 millimeters, preferably less than 1.3 millimeters, even more preferably less than 1.0 millimeters, for example 0.5 millimeters. A preferred range of particle sizes in this embodiment is 0.05 millimeters to 0.5 millimeters.

In some embodiments, the particle sizes are selected to have an extended range of sizes to improve the packing density and further reduce the effective area of the moisture resistant layer. For example, particles are selected to have diameters ranging from 0.05 millimeters up to 0.6 millimeters to allow the smaller particles to fit more easily into the gaps formed between larger particles. In other embodiments, the particle sizes range from 0.1 millimeters up to 2.0 millimeters are used for modules with gaps between sealing layers greater than 2.0 millimeters. The optimal range of particle sizes can be determined by optimizing the dry packing density before adding them to the moisture resistant layer, for example by following the methods described in U.S. Pat. No. 5,308,821, incorporated by reference herein for this purpose.

Figure 2:
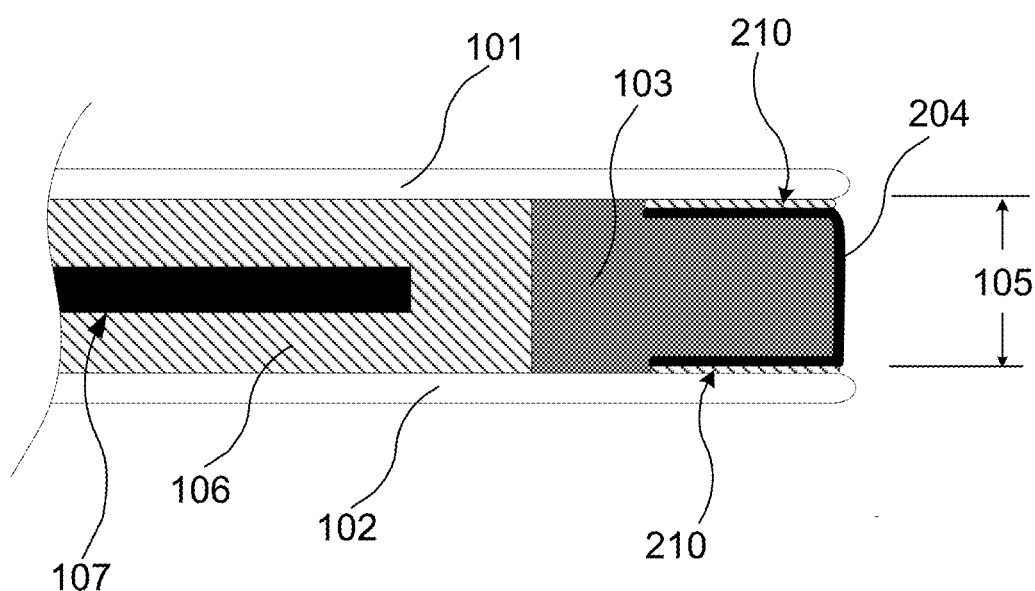
FIG. 2 shows a schematic cross sectional view of a photovoltaic module comprising a moisture resistant layer and a moisture barrier foil partially enclosing the moisture resistant layer according to one embodiment of the invention.

In another embodiment, shown in FIG. 2, a moisture barrier foil 204 is provided in the form of a flexible foil material such as a metal foil. In this embodiment, an optional adhesive material portion 210 may be used to secure the outward facing surface of the moisture barrier foil directly to one or both of sealing layers (101, 102). The adhesive material portion 210 may be comprised of butyl rubber, pressure sensitive adhesive, non-olefin thermoplastic polymers or thermal polymer olefin (TPO), or other suitable adhesives. In other embodiments, the adhesive material portion 210 is eliminated (not shown) and the flexible foil material adheres only to the moisture resistant layer 103. The moisture barrier foil 204 may be comprised of a variety of low-cost metallic compositions, for example aluminum, stainless steel, nickel, zinc, titanium, molybdenum, and alloys thereof. The foil may range in thickness from 10 microns to, for example, 1000 microns and still function to achieve a reduction in the effective cross-sectional area of moisture resistant layer 103.

In certain embodiments, the surfaces of front sealing layer 101 and back sealing layer 102, and/or the moisture barrier foil 204 may be treated to provide a means for improving the adhesion to composite encapsulants and/or the moisture resistant layer. A treatment may involve application of adhesives, primers (e.g., silanes, polyallylamine-based materials), flame treatments, plasma treatments, electron beam treatments, oxidation treatments, corona discharge treatments, chemical treatments, chromic acid treatments, hot air treatments, ozone treatments, ultraviolet light treatments, sand blast treatments, solvent treatments, and the like and combinations thereof.

Figure 3:
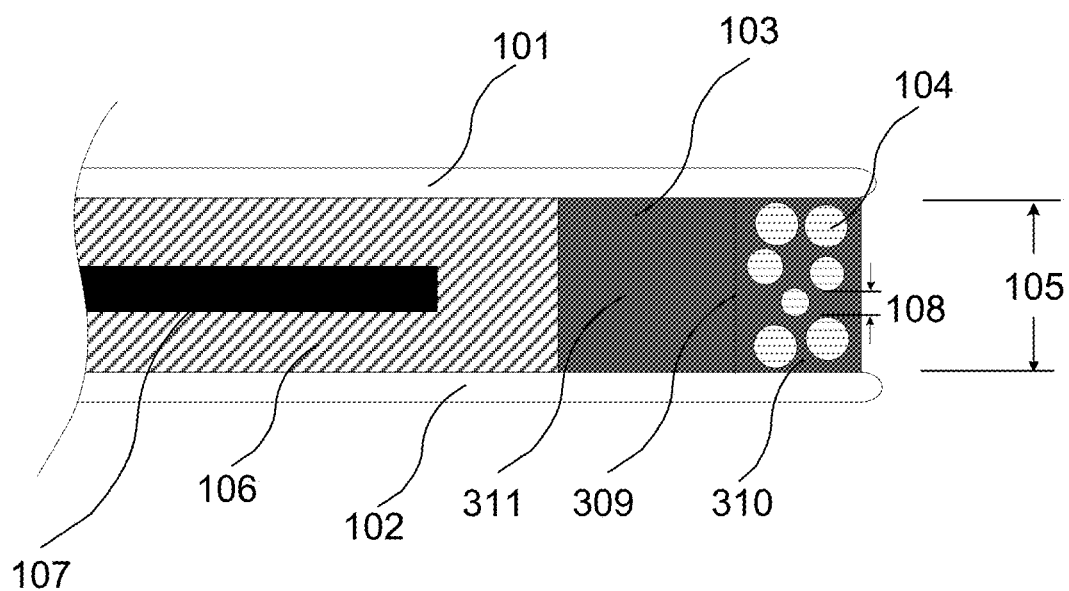
FIG. 3 shows a schematic cross sectional view of a photovoltaic module comprising a moisture resistant layer and moisture barrier particles according to one embodiment of the invention.

In another embodiment, shown in FIG. 3, moisture barrier particles 104 are distributed throughout a portion of the volume of the moisture resistant layer 103. Imaginary line 309 divides the particle-containing region 310 of the moisture resistant layer 103 and the substantially particle-free region 311 of the moisture resistant layer 103. In this embodiment, the effective area of the sealing layer is reduced, as in the embodiment shown in FIG. 1, but the volume of moisture barrier particles required to form the improved moisture resistant layer is reduced. A further advantage, in certain embodiments, is that the particle-free region 311 of the moisture resistant layer 103 can be applied in a separate step, or can be composed of a different material. In this embodiment, the materials of the substantially particle free region and the particle-containing region 310 of the moisture resistant layer 103 can be selected based on its suitability as a particle-free or particle-filled moisture resistant layer, for example based on their viscosity at the time of application. In another embodiment, the particle-filled layer 103 may be pre-mixed with moisture barrier particles prior to application. In one embodiment, the substantially particle free region 311 and the particle-containing region 310 of the moisture resistant layer 103 can include different materials. In another embodiment, the substantially particle free region 311 and the particle-containing region 310 of the moisture resistant layer 103 can have the same material.

In one embodiment, the outer surface of the moisture resistant layer 103 faces away from the at least one photovoltaic cells 107, and the moisture barrier particles 104 can be distributed not more than a lateral width of the particle-containing region 310. In this case, portions of the moisture resistant layer that are more than the lateral width of the particle containing region 310 away from the outer surface of the moisture resistant layer 103 can be substantially free of moisture barrier particles. In one embodiment, the lateral width of the particle containing region 310 can be in a range from 0.1 cm to 2.0 cm. In another embodiment, the lateral width of the particle containing region 310 can be in a range from 0.2 cm to 1.2 cm. In another embodiment, the lateral width of the particle containing region 310 can be in a range from 0.3 cm to 0.8 cm (such as 0.5 cm).

Figure 4A:
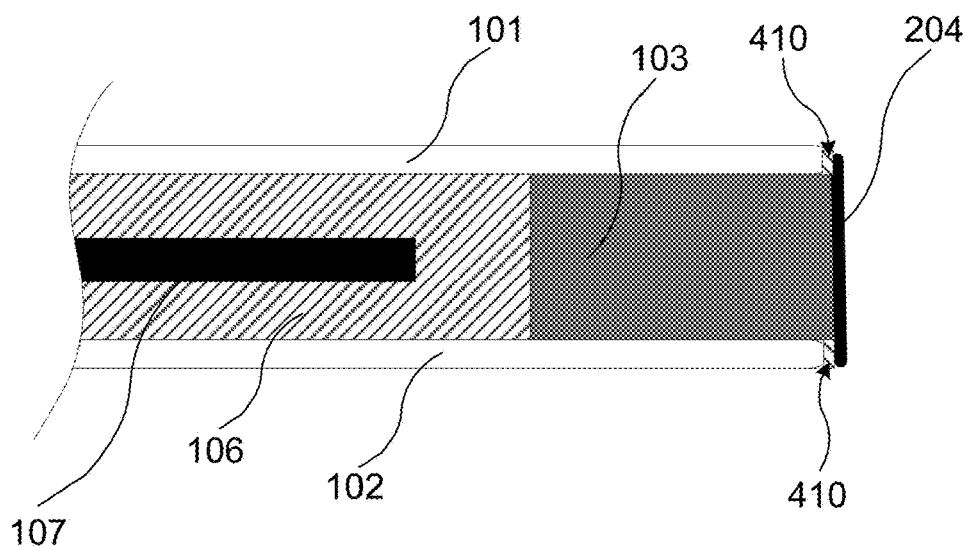
FIG. 4A shows a schematic cross sectional view of a photovoltaic module with a moisture resistant layer operatively connected to a moisture barrier foil according to one embodiment of the invention.

In another embodiment, shown in FIG. 4A, a moisture barrier foil 204 including flexible foil material is provided as a moisture barrier material portion. In this embodiment, an optional adhesive material portion 410 may be used to secure the inward facing surface of the moisture barrier foil directly to one or both sealing layers (101, 102). The adhesive material portion 410 may be comprised of butyl rubber, pressure sensitive adhesive, non-olefin thermoplastic polymers or thermal polymer olefin (TPO), or other suitable adhesives. In other embodiments, the adhesive material portion 410 may not be employed, and the flexible moisture barrier foil 204 adheres directly to the moisture resistant layer 103. The moisture barrier foil 204 may be comprised of a variety of low-cost metallic compositions, for example aluminum, copper, steel, nickel, zinc, and alloys thereof. The thickness of the moisture barrier foil 204 may be in a range from 10 microns to 1,000 microns. The moisture barrier foil 204 functions to reduce the effective cross-sectional area of moisture resistant layer 103.

Figure 4B:
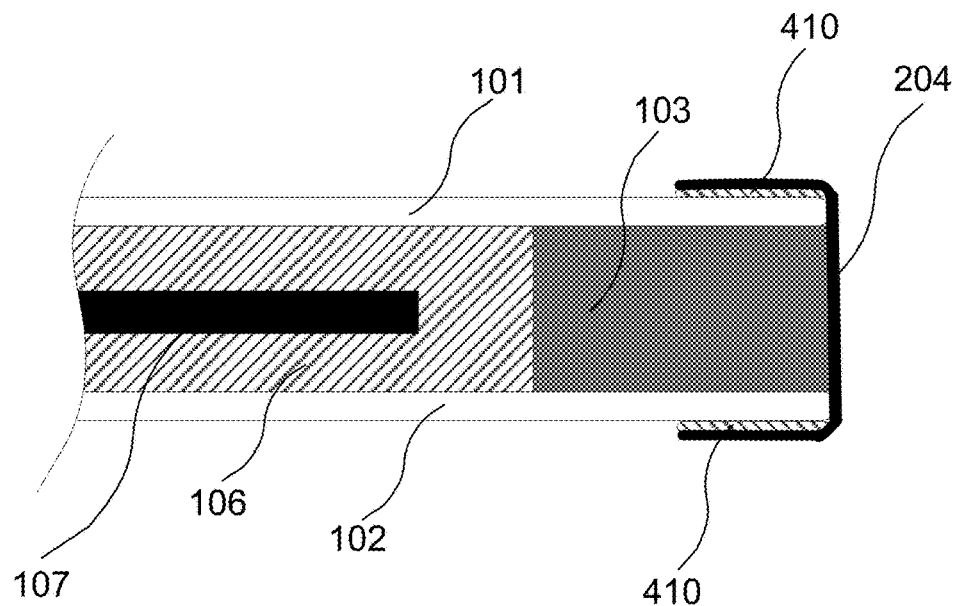
FIG. 4B shows a schematic cross sectional view of a photovoltaic module with a moisture resistant layer operatively connected to a moisture barrier foil according to one embodiment of the invention.

In another embodiment, shown in FIG. 4B, a moisture barrier foil 204 including flexible foil material is provided as in FIG. 4A. In this embodiment, an optional adhesive material portion 410 may be used to secure the inward facing surface of the moisture barrier foil directly to one or both sealing layers (101, 102). The adhesive material portion 410 may be comprised of butyl rubber, pressure sensitive adhesive, non-olefin thermoplastic polymers or thermal polymer olefin (TPO), or other suitable adhesives. In one embodiment, the moisture barrier foil 204 of any embodiment herein may be used in combination with the moisture resistant particles 104 of any embodiment described herein.

Figure 5A:
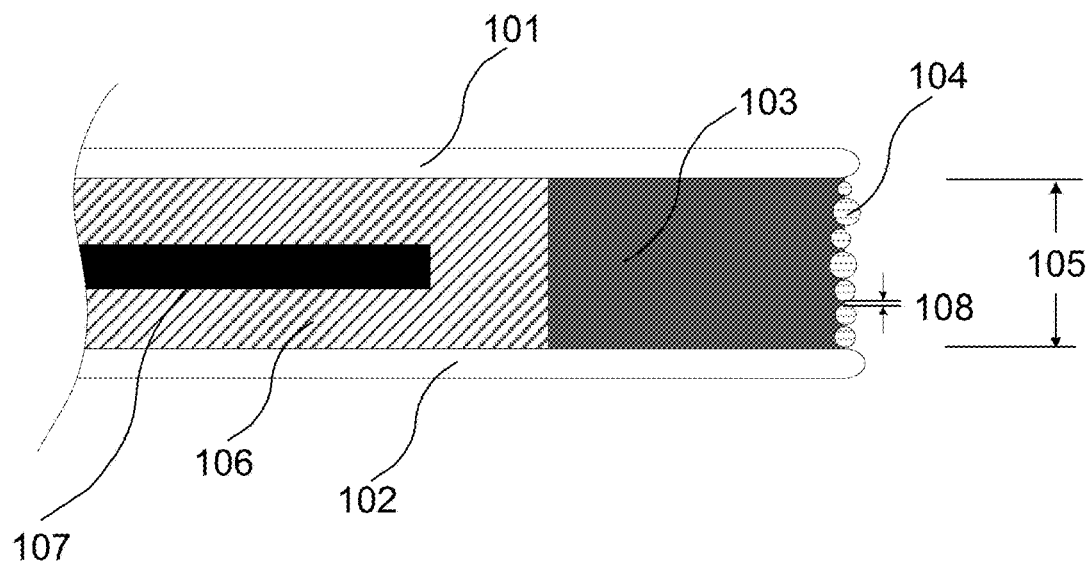
FIG. 5A and FIG. 5B show schematic cross sectional views of a photovoltaic module with a moisture resistant layer comprising moisture barrier particles according to one embodiment of the invention.
Figure 5B:
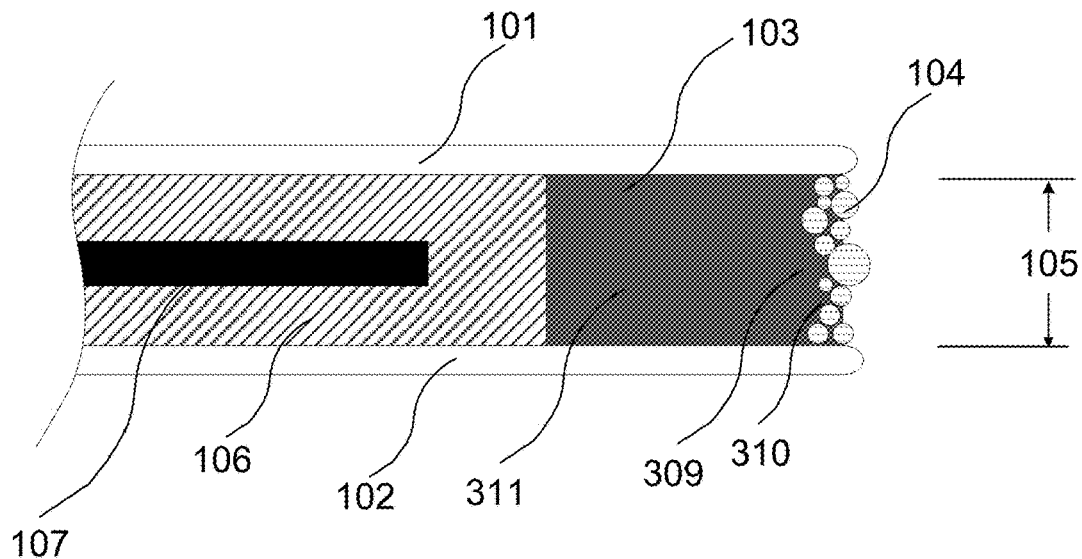

In a preferred embodiment, shown in FIG. 5A and FIG. 5B, moisture barrier particles 104 are embedded in the outer surface region of moisture resistant layer 103. In this embodiment, the particles may be applied to the outer surface of the moisture resistant layer after it has been applied to the perimeter of sealing layer(s) (101, 102). In this embodiment, the effective area of the sealing layer is reduced, as in the embodiment shown in FIG. 1, but the volume of moisture barrier particles required to form the improved moisture resistant layer is reduced. A further advantage, in certain embodiments, is that the moisture barrier particles can be rolled, blown, compressed, cold sprayed, or "sprinkled" into the uncured moisture resistance barrier layer during the manufacturing process. In these embodiments, the particle sizes are preferably smaller than the particle sizes used in the embodiments shown in FIGS. 1 and 3.

In one embodiment, the moisture barrier particles 104 may have a respective maximum dimension in a range from 0.01 millimeters to 0.6 millimeters. In another embodiment, the moisture barrier particles 104 may have a respective maximum dimension in a range from 0.02 millimeters to 0.2 millimeters. As used herein, a "maximum dimension" of a particle refers to the maximum distance between all pairs of points within the particle. Thus, the maximum dimension of a sphere is the diameter of the maximum dimension. For an elongated particle, the maximum dimension can be along the direction of the elongation. The maximum dimension of each moisture barrier particle 104 is herein referred to as a "size" of the moisture barrier particle 104.

The moisture barrier particles 104 can have a respective maximum dimension that is less than the thickness of the physically exposed portion of the moisture resistant layer 103. For example, the maximum dimensions of the moisture barrier particles 104 may be in a range from 0.04 times the thickness of the moisture barrier layer 103 (which may be the same as the spacing between the sealing layers (101, 102) to 0.5 times the thickness of the moisture barrier layer 103.

In one embodiment, the moisture barrier particles 104 can have a random size distribution in which the standard deviation of the maximum dimensions of the moisture barrier particles 104 can be at least 10% of the average of the maximum dimension of the moisture barrier particles 104. In one embodiment, the maximum dimensions of the moisture barrier particles 104 can have a substantially Gaussian distribution.

In one embodiment, the size of each moisture barrier particle 104 applied to the outer surface of the moisture resistant layer 103 may be in a range from 0.01 millimeters to 0.6 millimeters, or more preferably from 0.02 millimeters to 0.2 millimeters. In one embodiment, the moisture barrier particles 104 can have a distribution of particle sizes in which the average particle size is at least twice the tenth percentile particle size and is not greater than one half of the ninetieth percentile particle size.

In one embodiment, a physically exposed subset of the moisture barrier particles 104 can have a random pattern on the sidewall of the moisture resistant layer 103. In one embodiment, the density of the moisture barrier particles is high enough to reduce the effective area of the sealing layer by at least 80%, or preferably at least 90%. In this case, the density of the moisture barrier particles 104 can be selected such that at least 80%, and preferably at least 90%, of a total sidewall area of the moisture resistant layer 103 is covered by a subset of the moisture barrier particles 104.

In one embodiment, multiple layers of the moisture barrier particles 104 can be embedded within an outer portion of the moisture resistant layer 103 along a direction that is parallel to a front surface of the at least one photovoltaic cell 107, i.e., a horizontal direction in the drawings that is parallel to planar surfaces of the first and second sealing layers (101, 102). The edge surfaces of the first and second sealing layers (101, 102) may be curved or vertical. The horizontal surfaces of the first and second sealing layers (101, 102) are herein referred to major planar surfaces.

Figure 6:
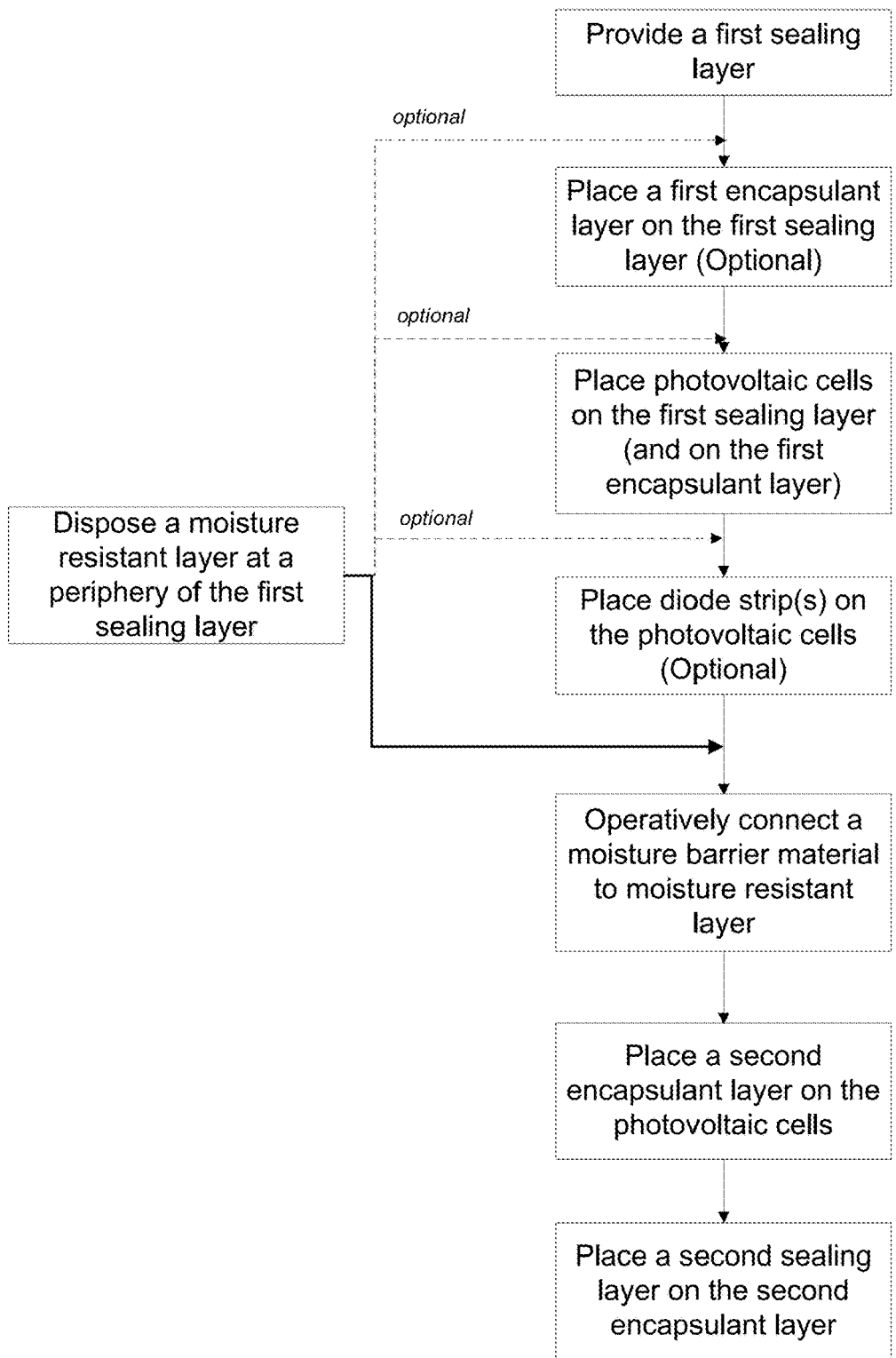
FIG. 6 is a process flowchart corresponding to a method of fabricating a photovoltaic module containing a moisture barrier in accordance with certain embodiments.

Referring to FIG. 6, a sequence for forming a sealed structure according to embodiments of the present disclosure is illustrated. A first sealing layer (101 or 102) is provided, which can be a front sealing layer or a back sealing layer.

Optionally, a first encapsulant layer can be applied on the first sealing layer. At least one photovoltaic cell 107 is disposed on the first encapsulant layer. The at least one photovoltaic cell may be disposed directly on the first sealing layer in case a first encapsulant layer is not employed, or may be disposed directly on the first encapsulant layer in case the first encapsulant layer is employed. Optionally, at least one bypass diode strip may be placed on the photovoltaic cells.

A moisture resistant layer (i.e., the moisture barrier layer) 103 can be applied at any step after the first sealing layer is provided. The moisture resistant layer 103 may be applied prior to application of the first encapsulant layer, or after application of the first encapsulant layer.

The moisture barrier material, such as the moisture barrier particles 104 and/or the moisture barrier foil 204, is operatively connected to the moisture resistant layer 103. For example, the moisture barrier particles 104 can be injected into and/or through the sidewalls of the moisture resistant layer 103 exposed between the sealing layers (101, 102). In one embodiment, the moisture resistant particles 104 are provided (e.g., injected and embedded) at least in a portion of the moisture resistant layer 103. The moisture barrier particles 104 can have a respective maximum dimension that is less than a thickness of the moisture resistant layer 103 as discussed above.

A second encapsulant layer may be applied after the at least one photovoltaic cell and the optional at least one diode strip are disposed to provide encapsulation of the at least one photovoltaic cell. The first encapsulant layer and the second encapsulant layer collectively constitute the encapsulating material portion 106.

Subsequently, a second sealing layer (102 or 101) is disposed and affixed to the encapsulating material portion 106 and the moisture resistant layer 103. If the first sealing layer is a front sealing layer, the second sealing layer is a back sealing layer, and vice versa. By disposing the second sealing layer on the moisture resistant layer 103, the at least one photovoltaic cell 107 is sealed within an enclosure including the first sealing layer (101 or 102), the second sealing layer (102 or 101), and the moisture resistant layer 103.

In one embodiment, the moisture barrier particles 104 can be embedded at an outer surface of the moisture resistant layer 103, and a subset of the moisture resistant particles 104 can be physically exposed on an outer sidewall of the moisture resistant layer 103. The moisture barrier particles 104 can comprise particles selected from metal particles, thermoplastic particles, and ceramic or glass particles.

In one embodiment, the moisture resistant particles 104 can be embedded only within a particle-containing region 310 that is more proximal to an outer sidewall of the moisture resistant layer 103. A substantially particle-free region is provided in a region of the moisture resistant layer 103 that is more distal from the outer sidewall of the moisture resistant layer than the particle-containing region 310.

In one embodiment, multiple layers of the moisture barrier particles 104 can be embedded within an outer portion of the moisture resistant layer along a direction that is parallel to a front surface of the at least one photovoltaic cell, which may be parallel to the major planar surfaces of the first and second sealing layers (101, 102). Further, multiple layers of the moisture barrier particles 104 of same or different sizes can be embedded within an outer portion of the moisture resistant layer along a direction that is parallel to the front surface of the at least one photovoltaic cell, i.e., along a direction that is parallel to the major planar surfaces of the first and second sealing layers (101, 102). The multiple layers of particles 104 prevent or reduce the number of direct linear paths through the gaps 108 for water vapor to reach the photovoltaic cell 107 between the sealing layers 101 and 102.

It is to be understood that the present invention is not limited to the embodiment(s) and the example(s) described above and illustrated herein, but encompasses any and all variations falling within the scope of the appended claims. For example, as is apparent from the claims and specification, not all method steps need be performed in the exact order illustrated or claimed, but rather in any order that allows the proper formation of the solar cells of the present invention.

What is claimed is:

1. A sealed photovoltaic module comprising:
   at least one photovoltaic cell positioned between a first sealing layer and a second sealing layer and having a light incident surface that faces toward a light source during operation, wherein one of the first and second sealing layers overlies the at least one photovoltaic cell and another of the first and second sealing layers underlies the at least one photovoltaic cell; and
   a moisture resistant layer located between the first and second sealing layers and extending around a portion of a perimeter around the at least one photovoltaic cell, wherein:
   the moisture resistant layer comprises:
      a particle-containing region including an outer surface of the moisture resistant layer and in which moisture barrier particles are disposed, the outer surface facing away from the at least on photovoltaic cell; and
      a substantially particle-free region disposed between the particle-containing region and the at least one photovoltaic cell;
   the lateral width of the particle-containing region is less than the lateral width of the particle-free region;
   moisture resistant layer comprises the same material in both the substantially particle-free region and in the particle-containing region; and
   the moisture barrier particles have a respective maximum dimension that is less than a thickness of the moisture resistant layer between the first and the second sealing layers.

2. The photovoltaic module of claim 1, wherein the moisture barrier particles have diameters between 0.05 millimeters and 0.5 millimeters.

3. The photovoltaic module of claim 1, wherein the moisture barrier particles comprise exposed moisture barrier particles that are partially embedded in and physically exposed from the outer surface of the moisture resistant layer.

4. The photovoltaic module of claim 3, wherein the moisture barrier particles have a maximum size between 0.02 millimeter and 0.2 millimeter.

5. The photovoltaic module of claim 1, wherein the moisture barrier particles comprise metal powder particles or beads.

6. The photovoltaic module of claim 1, wherein the moisture barrier particles comprise thermoplastic powder particles or beads.

7. The photovoltaic module of claim 1, wherein the moisture barrier particles comprise ceramic or glass powder particles or beads.

8. The photovoltaic module of claim 1, wherein the lateral width of the particle-containing region ranges from about 0.2 cm to about 1.2 cm.

9. The photovoltaic module of claim 1, wherein the moisture barrier particles have a respective maximum dimension in a range from 0.01 millimeters to 0.6 millimeters, and wherein the lateral width of the particle-containing region is in a range from 0.1 cm to 2.0 cm.

10. The photovoltaic module of claim 3, wherein a density of the moisture barrier particles is selected such that at least 80% of the outer surface of the moisture resistant layer is covered by the exposed moisture barrier particles.

11. The photovoltaic module of claim 3, wherein a density of the moisture barrier particles is selected such that at least 90% of the outer surface of the moisture resistant layer is covered by the exposed moisture barrier particles.

12. The photovoltaic module of claim 1, wherein the at least one photovoltaic cell is encapsulated by an encapsulating material located between the first and the second sealing layers and inside of the moisture resistant layer.

13. The photovoltaic module of claim 3, wherein multiple layers of the moisture barrier particles are embedded within the particle-containing region of the moisture resistant layer.

14. The photovoltaic module of claim 1, wherein the moisture barrier particles have a random size distribution in which a standard deviation of the maximum dimension of the moisture barrier particles is at least 10% of an average of the maximum dimension of the moisture barrier particles, and wherein a physically exposed subset of the moisture barrier particles has a random pattern on a sidewall of the moisture resistant layer.

* * * * *